United States Patent

Rooks

(10) Patent No.: US 9,024,661 B2
(45) Date of Patent: May 5, 2015

(54) GLITCH FREE CLOCK MULTIPLEXER

(71) Applicant: The United States of America as Represented by the Secretary of the Air Force, Washington, DC (US)

(72) Inventor: John W. Rooks, Rome, NY (US)

(73) Assignee: The United Sates of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/150,843

(22) Filed: Jan. 9, 2014

(65) Prior Publication Data

US 2014/0320170 A1    Oct. 30, 2014

Related U.S. Application Data

(60) Provisional application No. 61/817,362, filed on Apr. 30, 2013.

(51) Int. Cl.
*H03K 19/00*    (2006.01)
*H03K 17/00*    (2006.01)
*H03K 21/00*    (2006.01)

(52) U.S. Cl.
CPC .................................. *H03K 19/0016* (2013.01)

(58) Field of Classification Search
USPC ................................ 326/93; 327/99, 178, 365
See application file for complete search history.

(56) References Cited

U.S. PATENT DOCUMENTS

2010/0001767 A1*    1/2010    Shikata ........................... 327/99
2013/0214826 A1*    8/2013    Dahan et al. .................... 327/115

* cited by examiner

*Primary Examiner* — Daniel D Chang
(74) *Attorney, Agent, or Firm* — Joseph A. Macini

(57) ABSTRACT

Apparatus for glitch-free switching between two clock sources on an integrated circuit. Clock gaters provide a clock from a single source that can be turned on and off without causing partial pulses to be created. Control circuitry going to the individual clock gaters provides the ability to shut all clocks off for a period of time equal to the longest clock period. By combining the clocks with an OR gate and gating all clocks off before switching from one clock to another, a glitch-free train of clock pulses can be created from individual clock inputs. Since clock glitches can cause erratic behavior in integrated circuits, this invention allows one to switch between different (unrelated) clocks without causing erratic behavior.

3 Claims, 3 Drawing Sheets

GLITCH FREE CLOCK MULTIPLEXER

PRIORITY CLAIM UNDER 35 U.S.C. §119(e)

This patent application claims the priority benefit of the filing date of provisional application Ser. No. 61/817,362, having been filed in the United States Patent and Trademark Office on Apr. 30, 2013 and now incorporated by reference herein.

STATEMENT OF GOVERNMENT INTEREST

The invention described herein may be manufactured and used by or for the Government for governmental purposes without the payment of any royalty thereon.

BACKGROUND OF THE INVENTION

The Joint Test Action Group developed a 5 pin test access port standard which is commonly referred to as JTAG. JTAG is used for a variety of Integrated Circuit (IC) and board level tests. Currently some commercial tools allow automatic insertion of logic to switch between the IC's main clock and having the JTAG (TCK) clock driven onto the main clock distribution network. This functionality allows the standard JTAG interface to more effectively drive the inputs during test since the non-clock inputs can be scanned in and held steady while a clock is provided to the chip without having to perform another entire boundary scan just to change one signal.

A clock gater is a circuit that combines a latch (with inverted clock) and an AND gate. It has a "gate" input and a "clock" input. The latch with inverted clock ensures the gate (or control) signal cannot change while the clock is high. The gater's output is taken from the AND gate's output. The AND gate gets a slightly delayed clock on one input and the latch's output on its other input. Just before the clock goes high at the AND gate input the latch captures and holds the value of the gate signal. The AND gate will follow the clock with a slight delay if the gate signal was high just before the clock went high at the AND gate. The AND gate will stay low if the gate signal is low just prior to the clock going high. Had just an AND gate been used without the latch the gate signal may have cut short one of the clocks positive pulses, a clock gater prevents this. Typically clock gaters are used to save power by not clocking circuitry when it doesn't need to be active, and also to control functionality such as only clocking a register when you wish to load it with new data.

Prior art has simply multiplexed between the two clocks without ensuring only whole positive clock pulses were presented to the system and without ensuring there was adequate time between the last pulse of the clock being turned off and the first pulse of the clock being turned on. Alternatively custom circuitry (such as pass gates) in the prior art was not provided as standard cells for use in standard cell based designs and that custom circuitry does not work well with standard cell design flows.

Of particular concern is that the prior art does not insert special clock gaters and does not properly time the control of the two (or more) clocks. As a result, it is possible to get a partial clock pulse out of JTAG control circuitry in either the positive (short time at "1") or negative (short time at "0") sense. A partial clock can cause erratic behavior from the integrated circuit.

OBJECTS AND SUMMARY OF THE INVENTION

It is therefore an object of the present invention to provide an apparatus that overcomes the prior art's limitations in selecting one of several clocks to be used in clocking an integrated circuit. This apparatus will switch between two clocks ensuring no short pulses are created, either a short time at "1" or a short time at "0"

Another object of the present invention is to provide an apparatus that uses bits from the JTAG instruction register (or a data register) to control properly gated clock signals. The JTAG control bit or bits can be properly timed with hardware or by requiring multiple JTAG scans such that there is a clean switch between the processor's main clock and the JTAG clock. By using glitch-free clock gaters on the individual clocks, properly timed controls to those gaters, and an OR logic gate; the resulting output provides full width positive pulses when switching between clocks.

Yet another object of the present invention is to provide an apparatus that ensures one bit of the JTAG instruction register drives the "gate" input for the main clock gater and another bit drives the "gate" input for the JTAG clock gater, while an OR gate performs an OR function on the two clocks, its output passes through a 1 when either input is a 1.

Briefly stated, the present invention provides an apparatus for glitch-free switching between two clock sources on an integrated circuit. Clock gaters provide a clock from a single source that can be turned on and off without causing partial pulses to be created. Control circuitry going to the individual clock gaters provides the ability to shut all clocks off for a period of time equal to the longest clock period. By combining the clocks with an OR gate and gating all clocks off before switching from one clock to another, a glitch-free train of clock pulses can be created from individual clock inputs. Since clock glitches can cause erratic behavior in integrated circuits, this invention allows one to switch between different (unrelated) clocks without causing erratic behavior.

The above and other objects, features and advantages of the present invention become apparent from the following description read in conjunction with the accompanying drawings, in which like reference numerals designate the same elements.

DETAILED DESCRIPTION OF THE PREFERRED EMBODIMENT

Figure 1:
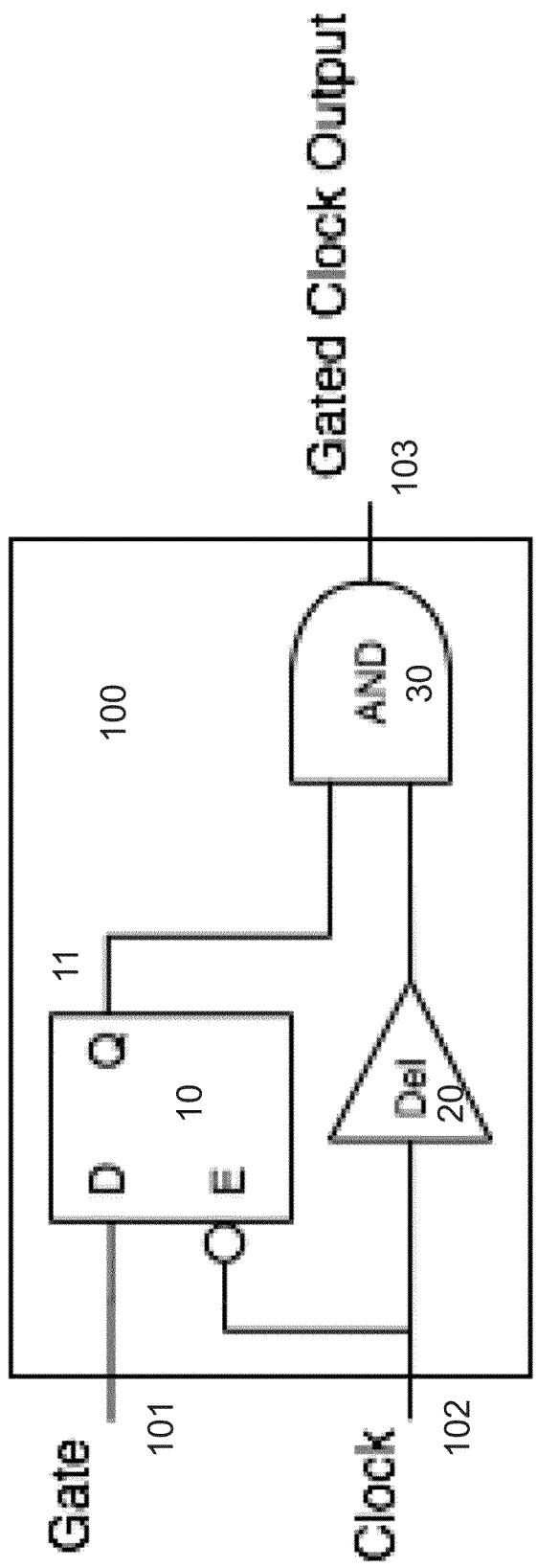
FIG. 1 is a schematic diagram representation of a prior art clock gater.

Referring to FIG. 1, the key components of a generic prior art clock gater 100 include a gate input 101, which determines if the clock will be passed through or if the output 103 will drive a zero instead. Positive pulses from the clock input 102 are optionally passed to the clock gater output 103 based on the latched value captured by latch 10. Delay cell 20 ensures that the latch 10 has a stable output 11 feeding into AND gate 30 prior to the clock rising edge arriving from delay 20. The clock gater circuitry 100 along with appropriate timing constraints ensures that only whole clock pulses pass through to its output 103.

Figure 2:
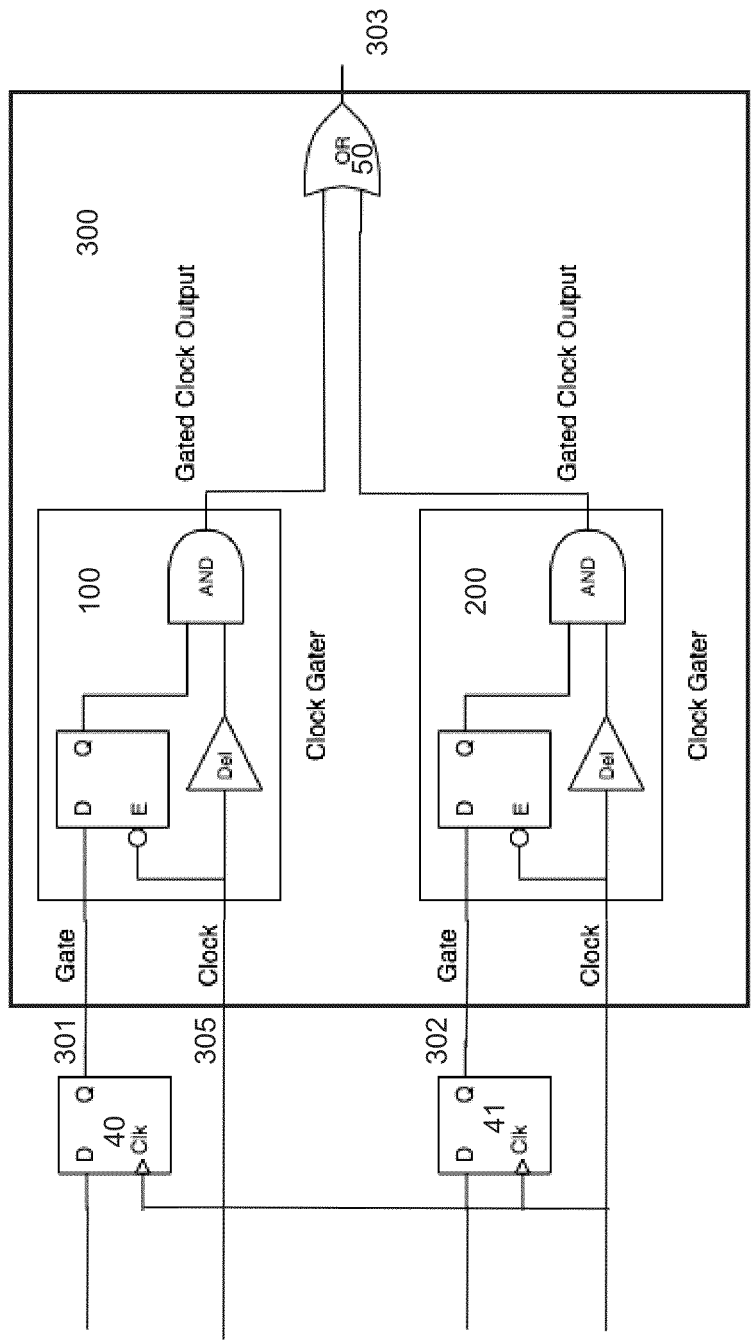
FIG. 2 is a schematic diagram representation of the present invention.

Referring to FIG. 2, the key components of this invention 300, are two or more clock gaters 100, 200, control inputs 301, and 302 from the JTAG instruction or other suitable register, and an OR gate 50. JTAG instruction register bits 40 and 41 drive the individual clock gator inputs 301 and 302.

STAG register bit 40 resets to 1, register bit 41 resets to 0, (input 301 is 1, input 302 is 0), on reset the main clock 305 is passed through to output 303. In order to change the clock driving output 303, a JTAG instruction scan (and update) would be performed setting both bit 40 and bit 41 to zero. Followed by a second STAG instruction scan (and update) keeping bit 40 at zero and setting bit 41 to 1. The individual gaters 100, 200, ensure only whole positive pulses are provided to OR gate 50, resulting in whole pulses at the output 303. A JTAG scan time period is much longer than either the main clock period presented at 301 or the JTAG clock period presented at 302. By setting both bit 301 and 302 to zero for a JTAG scan any overlap in the output of the two gaters 100, 200 is avoided.

Figure 3:
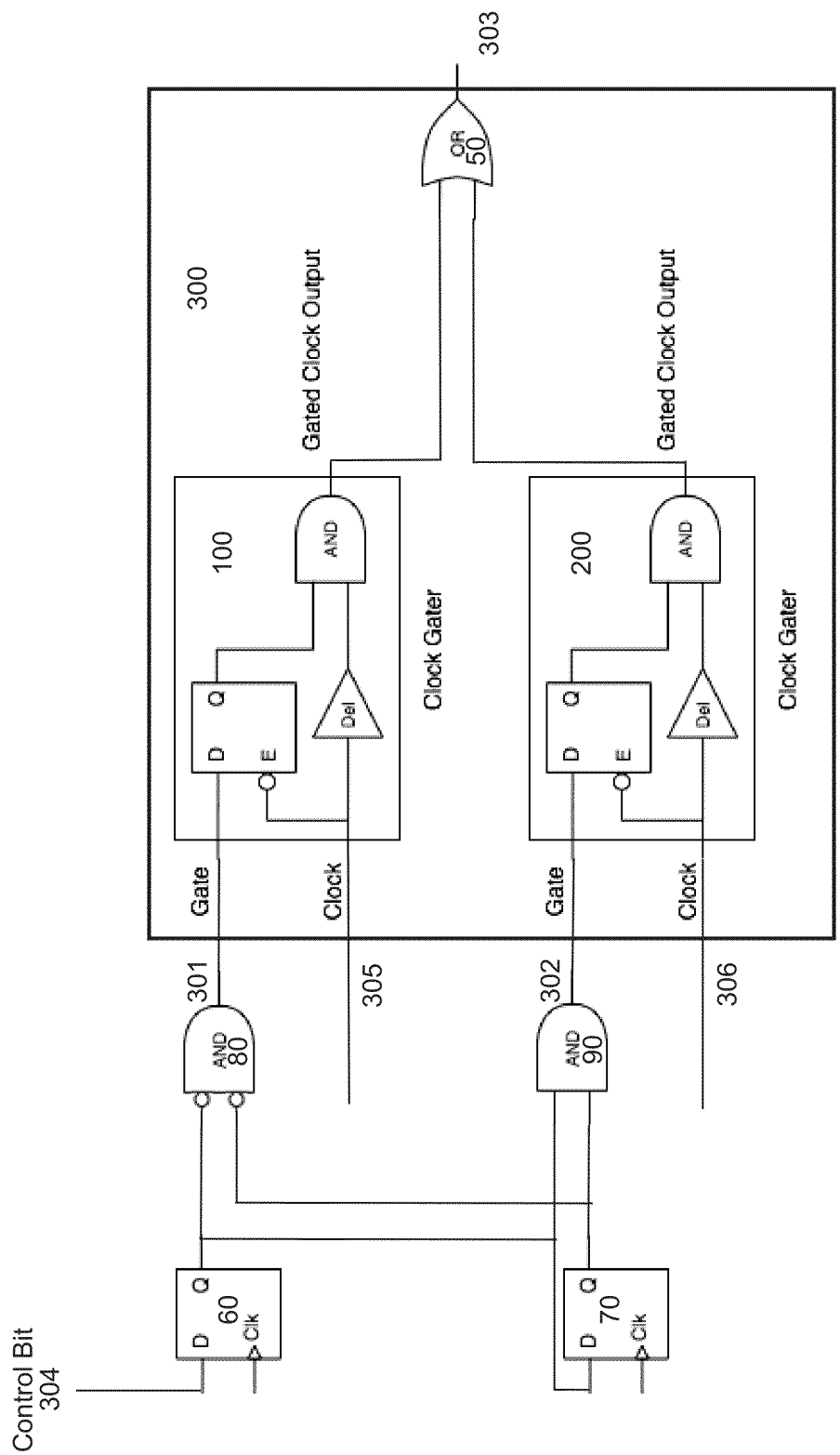
FIG. 3 is schematic diagram representation of an alternate embodiment of the present invention.

Referring to FIG. 3, depicts an alternate embodiment of the present invention which ensures a time period where both clocks are gated. Two flip-flops 60, 70, one AND gate with inverting inputs 80, and one AND gate 90, are used to switch between the two clock enable inputs 301, 302, without concern for timing of the switch. One input 304 is provided to select one of the two inputs. Input 304 is registered in flip-flop 60. The output of 60 is registered in flip-flop 70. Inverting input AND gate 80 provides a "1" upon reset or whenever both flip-flops 60, 70 are "0". The output of 80 drives 301, when 301 is "1" Clock Gater 100 passes the clock input applied on 305 through OR gate 50 to output 303. Conversely if the input 304, is driven high, first flip-flop 60 and then flip-flop 70 (on the following clock cycle) will go high resulting in AND gate 90 providing a "1" to 302. The JTAG clock is used to drive the clock inputs for both 60 and 70. The JTAG clock period is longer than the main clock period, (applied at input 305). The output of the AND gate 80 goes to zero as soon as the flip-flop 60 registers a "1", not waiting until both 60 and 70 output "1". Likewise AND gate 90 does not output "1" until both 60 and 70 output "1". Similarly when input 304 transitions from "1" to a "0" the circuitry ensure there is a one JTAG clock period when both 301, and 302 are "0".

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A glitch free multi-clock control circuit comprising
a plurality of clock gater circuits, each having a clock input, a gate input, and a gated clock output;
an OR gate having inputs and an output, each said input being connected to a corresponding gated clock output of said clock gater circuits; and
a latch corresponding to each said clock gater circuit, each said latch having a clock input, a set input, and an output, wherein said output is connected to said gate input of said corresponding clock gater circuit;
wherein each of said plurality of clock gater circuits further comprises
a clock gater latch having an inverting clock input, a gate input, and an output;
a delay cell having an input and an output; and
an AND gate having a first and a second input and an output; wherein
said gate input of said clock gater latch is connected to said gate input of said clock gater circuit;
said inverting clock input is connected to said input of said delay cell and to said clock input of said clock gater circuit;
said output of said delay cell is connected to said second input of said AND gate;
said output of said clock gater latch is connected to said first input of said AND gate; and
said output of said AND gate is connected to said gated clock output of said clock gater circuit.

2. A glitch free multi-clock control circuit comprising
a first and a second clock gater circuit, each having a clock input, a gate input, and a gated clock output;
an OR gate having a first and a second input and an output, said first input being connected to said gated clock output of said first clock gater circuit and said second input being connected to said gated clock output of said second clock gater circuit;
a first AND gate, said first AND gate having an output and first inverting and a second inverting inputs, wherein said output is connected to said gate input of said first clock gater circuit;
a second AND gate, said second AND gate having an output and a first and a second input, wherein said output is connected to said gate input of said second clock gater circuit;
a first latch having a clock input, a set input, and an output, wherein said output is connected to said first inverting input of said first AND gate;
a second latch having a clock input, a set input, and an output, wherein said output is connected to said second input of said second AND gate; and wherein
said first inverting input of said first AND gate is connected to said first input of said second AND gate and said set input of said second latch; and
said second inverting input of said first AND gate is connected to said second input of said second AND gate.

3. The glitch free multi-clock control circuit of claim 2, wherein each of said plurality of clock gater circuits further comprises
a clock gater latch having an inverting clock input, a gate input, and an output;
a delay cell having an input and an output; and
an AND gate having a first and a second input and an output; wherein
said gate input of said clock gater latch is connected to said gate input of said clock gater circuit;
said inverting clock input is connected to said input of said delay cell and to said clock input of said clock gater circuit;
said output of said delay cell is connected to said second input of said AND gate;
said output of said clock gater latch is connected to said first input of said AND gate; and
said output of said AND gate is connected to said gated clock output of said clock gater circuit.

* * * * *